United States Patent
Barak et al.

(10) Patent No.: US 7,521,991 B2
(45) Date of Patent: Apr. 21, 2009

(54) BALANCED BAND-PASS FILTER FOR RADIO RECEIVERS

(75) Inventors: Ilan Saul Barak, Kfar Saba (IL); Kobi Ben-Atar, Holon (IL); Eric L Unruh, San Jose, CA (US)

(73) Assignee: SPG Ltd., Herzliya (IL)

( * ) Notice: Subject to any disclaimer, the term of this patent is extended or adjusted under 35 U.S.C. 154(b) by 561 days.

(21) Appl. No.: 11/273,517

(22) Filed: Nov. 14, 2005

(65) Prior Publication Data

US 2007/0111693 A1    May 17, 2007

(51) Int. Cl.
*H04B 1/10* (2006.01)
(52) U.S. Cl. ........................ 327/557; 327/552
(58) Field of Classification Search .......... 327/551–559
See application file for complete search history.

(56) References Cited

U.S. PATENT DOCUMENTS

| | | | |
|---|---|---|---|
| 5,625,317 A * | 4/1997 | Deveirman | 327/553 |
| 5,630,228 A | 5/1997 | Mittel | |
| 5,852,722 A | 12/1998 | Hamilton | |
| 5,862,323 A | 1/1999 | Blakley, III et al. | |
| 6,967,606 B2 * | 11/2005 | Wiesbauer et al. | 341/143 |
| 7,002,403 B2 * | 2/2006 | Marholev | 327/552 |
| 7,057,451 B2 * | 6/2006 | Lou et al. | 327/553 |
| 7,075,364 B2 * | 7/2006 | Gudem et al. | 327/552 |
| 7,196,574 B1 * | 3/2007 | Vishinsky | 327/557 |

OTHER PUBLICATIONS

Chen, "The Circuits and Filters Handbook", CRC Press, Dec. 2002, Section 81.2, pp. 2472-2475.
Banu and Tsividis, "Fully Integrated Active RC Filters in MOS Technology", IEEE Journal of Solid-State Circuits, vol. SC-18, No. 6, Dec. 1983, pp. 651-664.

* cited by examiner

*Primary Examiner*—Lincoln Donovan
*Assistant Examiner*—Hai L. Nguyen
(74) *Attorney, Agent, or Firm*—Ladas and Parry LLP

(57) ABSTRACT

A filter includes an input and an output. First and second filter stages having respective stage inputs and stage outputs are connected in cascade between the input and the output. Each filter stage includes an amplifier having an amplifier input and an amplifier output and an inner feedback loop connecting the amplifier output to the amplifier input. An outer feedback loop connects the stage output of the second filter stage with the stage input of the first filter stage. The first and second filter stages and the outer feedback loop are arranged so that an s-space closed-loop transfer function of the filter includes two zeros and a single pole.

21 Claims, 2 Drawing Sheets

BALANCED BAND-PASS FILTER FOR RADIO RECEIVERS

FIELD OF THE INVENTION

The present invention relates generally to radio frequency (RF) integrated circuits, and particularly to methods and devices for implementing active balanced band-pass filters in RF integrated circuits.

BACKGROUND OF THE INVENTION

Active resistance-capacitance (RC) band-pass filters are commonly used in various radio receiver designs. For example, U.S. Pat. Nos. 5,630,228, 5,862,323, 5,852,722, whose disclosures are incorporated herein by reference, describe receiver configurations that employ active filters.

Some applications use single-ended or unbalanced active filter configurations. For example, Chen describes an unbalanced active RC filter design called a "Sallen and Key" filter, in "The Circuits and Filters Handbook," CRC Press, December, 2002, section 81.2, pages 2472-2475, which is incorporated herein by reference.

Other applications use balanced, or differential, filter configurations. For example, Banu and Tsividis describe a balanced fifth-order active band-pass filter in "Fully Integrated Active RC Filters in MOS Technology," IEEE Journal of Solid-State Circuits, volume SC-18, number 6, December 1983, pages 651-64, which is incorporated herein by reference.

In some applications, such as the Banu and Tsividis paper cited above, active filters are implemented in a fully-integrated manner in a radio-frequency integrated circuit (RFIC).

SUMMARY OF THE INVENTION

In many practical applications, band-pass filters are required to filter signals whose strengths vary over a wide dynamic range. Some conventional active band-pass filters distort the filtered signal when the signal level in some of the active elements approaches saturation. The distortion produced by the filter degrades the quality of the filtered signal. In frequency shift keying (FSK) receivers, for example, such distortion causes an effect referred to as "eye compression," as will be explained below. Eye compression typically degrades the demodulation performance of the receiver and produces errors in the demodulated data.

The distortion of the filtered signal is often caused by instability of filter stages, which go into pumped oscillations at high signal levels. Conventional filters that have relatively small phase margins are particularly susceptible to such oscillations.

Embodiments of the present invention provide improved active RC band-pass filters and methods for designing such filters, so as to reduce the distortion produced by the filter. The filter configuration described herein has a closed loop s-space transfer function having two zeros and a single pole. As a result, the filter has a large phase margin, which enables the filter to remain stable under strong signal conditions. In some embodiments, the filter configuration is balanced, making it particularly suitable for implementation in analog RFICs.

The disclosed filter configurations comprise two differential filter stages, each comprising an operational amplifier and peripheral resistors and capacitors.

In one embodiment, a balanced filter is used as the down-converter band-pass filter of an FSK receiver.

In another embodiment, two or more band-pass filters are cascaded in order to improve the filtering performance and to reduce the effects of RFIC fabrication tolerances.

Methods for designing balanced band-pass filters for specified center frequency, gain, quality factor (Q) and bandwidth are also described hereinbelow.

There is therefore provided, in accordance with an embodiment of the present invention, a filter including:

an input and an output;

first and second filter stages, having respective stage inputs and stage outputs, connected in cascade between the input and the output, each filter stage including an amplifier having an amplifier input and an amplifier output and an inner feedback loop connecting the amplifier output to the amplifier input; and an outer feedback loop connecting the stage output of the second filter stage with the stage input of the first filter stage, wherein the first and second filter stages and the outer feedback loop are arranged so that an s-space closed-loop transfer function of the filter includes two zeros and a single pole.

In an embodiment, the stage input of the first filter stage includes a differential input, the stage output of the second filter stage includes a differential output, and the first and second filter stages include differential stages in which the amplifier includes a balanced amplifier.

In another embodiment, at least one of the two zeros is located at a zero frequency.

In yet another embodiment, the closed-loop transfer function includes a band-pass transfer function.

In still another embodiment, the filter is implemented in a radio-frequency integrated circuit (RFIC). Additionally or alternatively, at least part of the filter is implemented using discrete components.

There is also provided, in accordance with an embodiment of the present invention, a filter chain including two or more filters connected in series, each filter including:

an input and an output;

first and second filter stages, having respective stage inputs and stage outputs, connected in cascade between the input and the output, each filter stage including an amplifier having an amplifier input and an amplifier output and an inner feedback loop connecting the amplifier output to the amplifier input; and an outer feedback loop connecting the stage output of the second filter stage with the stage input of the first filter stage, wherein the first and second filter stages and the outer feedback loop are arranged so that an s-space closed loop transfer function of the filter includes two zeros and a single pole.

In an embodiment, a transfer function of the filter chain includes spectral zeros controlled by gains of the two or more filters.

There is additionally provided, in accordance with an embodiment of the present invention, a radio receiver including:

a mixer, which is coupled to down-convert an input radio-frequency (RF) signal using a local oscillator (LO) signal, so as to produce an intermediate-frequency (IF) signal; and a band-pass filter, which is coupled to filter the IF signal to produce a desired frequency range of received signals, the filter including:

a differential input and a differential output;

first and second differential filter stages, having respective stage inputs and stage outputs, connected in cascade between the differential input and the differential output, each filter stage including a balanced amplifier having an amplifier input and an amplifier output and an inner feedback loop connecting the amplifier output to the amplifier input; and an outer feedback loop connecting the stage output of the second filter stage with the stage input of the first filter stage, wherein the first and second filter stages and the outer feedback loop are arranged so that an s-space closed loop transfer function of the band-pass filter includes two zeros and a single pole.

There is further provided, in accordance with an embodiment of the present invention, a method for producing a filter, including:

forming an input and an output;

connecting first and second filter stages having respective stage inputs and stage outputs in cascade between the input and the output, each filter stage including an amplifier having an amplifier input and an amplifier output;

in each filter stage, connecting an inner feedback loop between the amplifier output and the amplifier input; and connecting an outer feedback loop between the stage output of the second filter stage and the stage input of the first filter stage, wherein the first and second filter stages and the outer feedback loop are arranged so that an s-space closed loop transfer function of the filter includes two zeros and a single pole.

In an embodiment, the method further includes:

accepting filter requirements including at least one of a center frequency, a gain, a quality factor and a bandwidth;

assigning capacitance values to capacitors of the filter;

assigning a gain value K to the inner feedback loop of the second filter stage; and computing resistance values of resistors of the filter, responsively to the filter requirements, the capacitance values and the inner feedback loop gain.

There is also provided, in accordance with an embodiment of the present invention, a method for producing a filter chain, including:

producing two or more filters, wherein producing each filter includes:

forming an input and an output;

connecting first and second filter stages having respective stage inputs and stage outputs in cascade between the input and the output, each filter stage including an amplifier having an amplifier input and an amplifier output;

in each filter stage, connecting an inner feedback loop between the amplifier output and the amplifier input; and connecting an outer feedback loop between the stage output of the second filter stage and the stage input of the first filter stage, wherein the first and second filter stages and the outer feedback loop are arranged so that an s-space closed loop transfer function of the filter includes two zeros and a single pole; and connecting the two or more filters in series to produce the filter chain.

The present invention will be more fully understood from the following detailed description of the embodiments thereof, taken together with the drawings in which:

DETAILED DESCRIPTION OF EMBODIMENTS
SYSTEM DESCRIPTION

Figure 1:
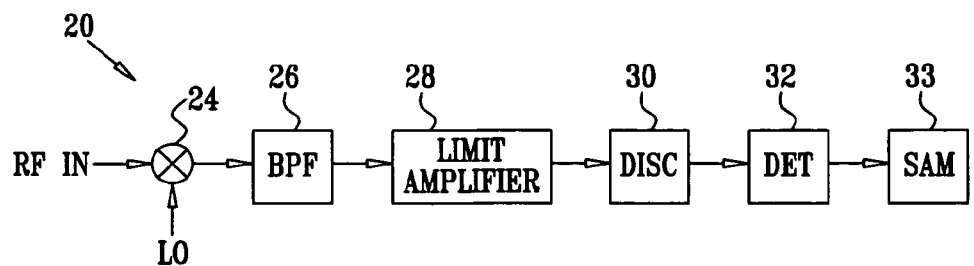
FIG. 1 is a block diagram that schematically illustrates a radio receiver, in accordance with an embodiment of the present invention.

FIG. 1 is a block diagram that schematically illustrates a radio receiver 20, in accordance with an embodiment of the present invention. The configuration of receiver 20 is a typical frequency modulation (FM) or frequency-shift-keying (FSK) receiver configuration. FM and FSK receivers having this configuration are commonly used in a variety of communication applications including pagers, mobile phones, cordless phones, microwave links and many others.

A radio-frequency (RF) signal is applied to receiver 20. In many practical cases, the strength of the RF signals at the receiver input varies over a wide dynamic range, often comprising extremely strong signals. The input signal is down-converted by a mixer 24 that mixes the RF signal with a local oscillator (LO) signal. The resulting intermediate-frequency (IF) signal is filtered by a band-pass filter 26, which passes the desired frequency range of the received signals and suppresses undesired mixing products and image signals produced by mixer 24, as well as other out-of-band signals. In some embodiments, band-pass filter 26 comprises an active RC filter having a balanced configuration, which is implemented using methods that will be explained hereinbelow.

The filtered signal at the output of filter 26 is amplified by a limiting amplifier 28, which typically has a logarithmic amplitude response. Amplifier 28 serves to reduce the dynamic range of the signal. The signal is then applied to a frequency discriminator 30. The discriminator produces a voltage that is proportional to the instantaneous frequency of the signal at its input. In other words, the discriminator converts a frequency-modulated (FM) waveform into an amplitude-modulated (AM) voltage. The discriminator output is detected by an amplitude detector 32 and sampled by a sampler 33 at a predefined symbol rate. Sampler 33 typically comprises an analog to digital (A/D) converter. The output of sampler 33 is typically processed by digital signal processing (DSP) circuitry (not shown) to extract the modulated data.

In some embodiments, receiver 20 or parts of it are implemented in an analog integrated circuit, such as a radio frequency integrated circuit (RFIC). Sampler 33, however, is often excluded from the RFIC and included in the DSP circuitry.

Although FIG. 1 shows filter 26 as part of an FM/FSK receiver, the principles of the present invention can be used to design active balanced band-pass or low-pass filters that are highly stable under strong signal conditions for other applications. Such additional applications may comprise, for example, various control loops, servo devices and filters in audio systems.

Figure 2A:
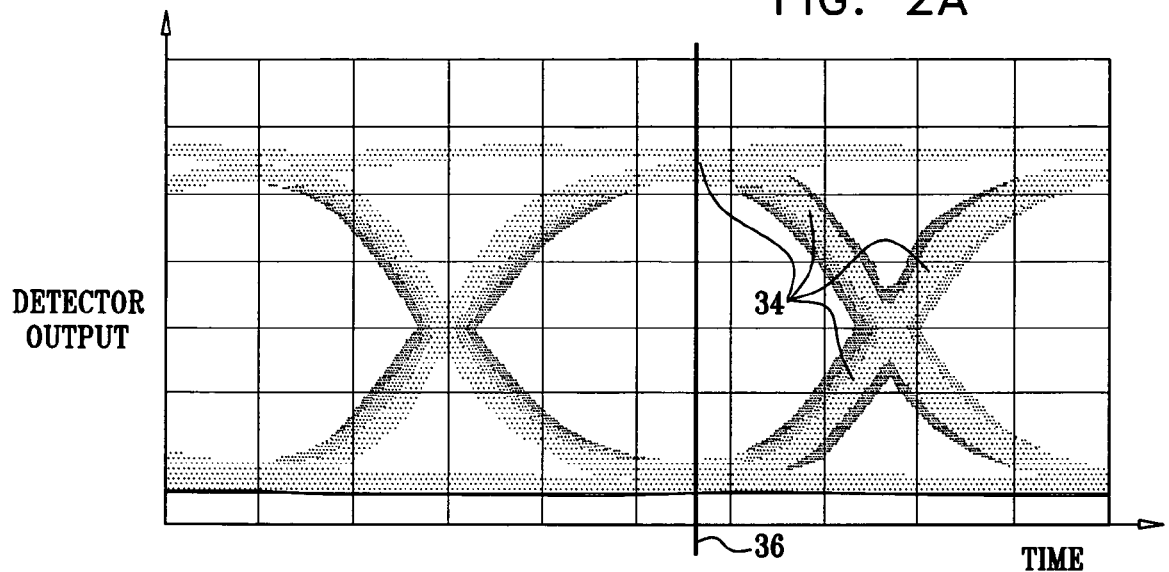
FIGS. 2A-2B are signal diagrams that schematically illustrate eye patterns, in accordance with an embodiment of the present invention.

FIG. 2A is a signal diagram that schematically illustrates signal waveforms at the output of detector 32, in accordance with an embodiment of the present invention. The signal shown in FIG. 2A is a binary FSK signal, in which each symbol represents one data bit. In binary FSK, a "0" data value is mapped to a symbol that has a negative frequency offset with respect to the carrier frequency. A "1" data value is mapped to a symbol having a positive frequency offset. As explained above, discriminator 30 translates frequency offsets to amplitude variations in its output voltage, and these voltages are detected by amplitude detector 32. Therefore, the vertical axis of FIG. 2A corresponds to the instantaneous frequency of the FSK signal.

Curves 34 show detected waveforms of the FSK signal. Multiple signal trajectories 34 are shown. The drawn signal trajectories are synchronized with the symbol timing of the FSK signal. The presentation format of FIG. 2A is called an "eye diagram," which is a common technique for presenting and evaluating FM schemes. A line 36 marks the optimal sampling time. As can be seen in the figure, all signal trajectories 34 cross line 36 at one of two well-defined amplitudes. These two amplitudes correspond to the "0" and "1" data values carried by the FSK symbols. It is thus straightforward for sampler 33 to differentiate between 0-modulated symbols and 1-modulated symbols. The eye diagram of FIG. 2A typically enables high quality data demodulation with a low error probability.

Figure 2B:
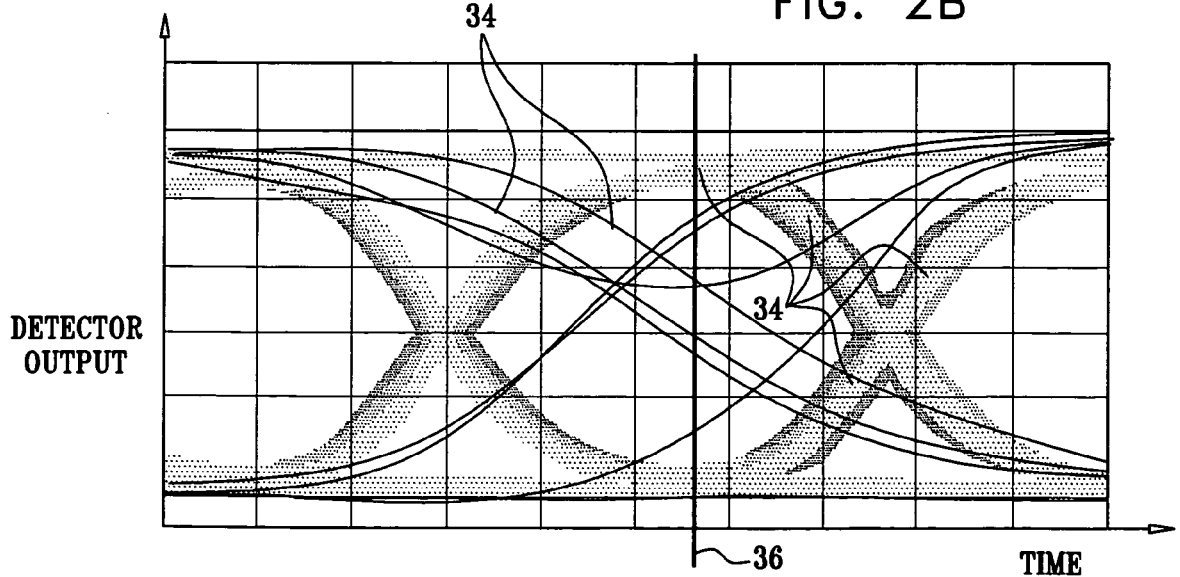

FIG. 2B is a signal diagram that schematically illustrates another eye diagram, with degraded demodulation conditions. In comparison to the eye diagram shown in FIG. 2A above, signal trajectories 34 in FIG. 2B cross line 36 at several amplitudes. For some signal trajectories it is difficult to determine whether they correspond to "0" or "1" data value. The eye diagram of FIG. 2B typically corresponds to poor demodulation performance and a high error probability. The shape of the signal trajectories in FIG. 2B is commonly referred to as a "closed eye," compared to the "open eye" in FIG. 2A.

Several factors typically contribute to the "closing" of the eye, or distortion of the eye diagram. These factors include, for example, low signal-to-noise ratio, poor symbol synchronization, high phase noise and non-linear signal distortion. In many receiver designs, as the input signal level approaches the receiver saturation level, some of the receiver components begin to oscillate and produce non-linear distortion products. These products may distort the signal amplitude, its phase, or both.

In particular, when a conventional active band-pass filter is used by the receiver, some of the filter stages may oscillate at high signal levels. These oscillations typically cause significant non-linear distortion that is clearly visible in the eye diagram of the distorted signal. The distorted signal trajectories of FIG. 2B, for example, may be caused by such filter oscillations. Distortion of the eye diagram as a result of non-linear saturation effects is sometimes referred to as "eye compression."

Active filters that use bi-quad stages, as is known in the art, are typically susceptible to eye compression at high signal levels because of their relatively small closed-loop phase margin. Some known bi-quad filter configurations have s-space closed loop transfer functions comprising two poles and two zeros. As the signal at the input of the filter increases, the amplifier gain begins to compress. Typically, the transfer delay of an operational amplifier increases near saturation. In such a bi-quad stage, the higher delay inside the closed loop can cause instability and oscillations.

Although the exemplary plots of FIGS. 2A and 2B refer to binary FSK signals, the principles of the present invention can be used to produce band-pass filters for filtering signals having other modulation types, as well.

Balanced Active Band-Pass Filter Configuration

Figure 3:
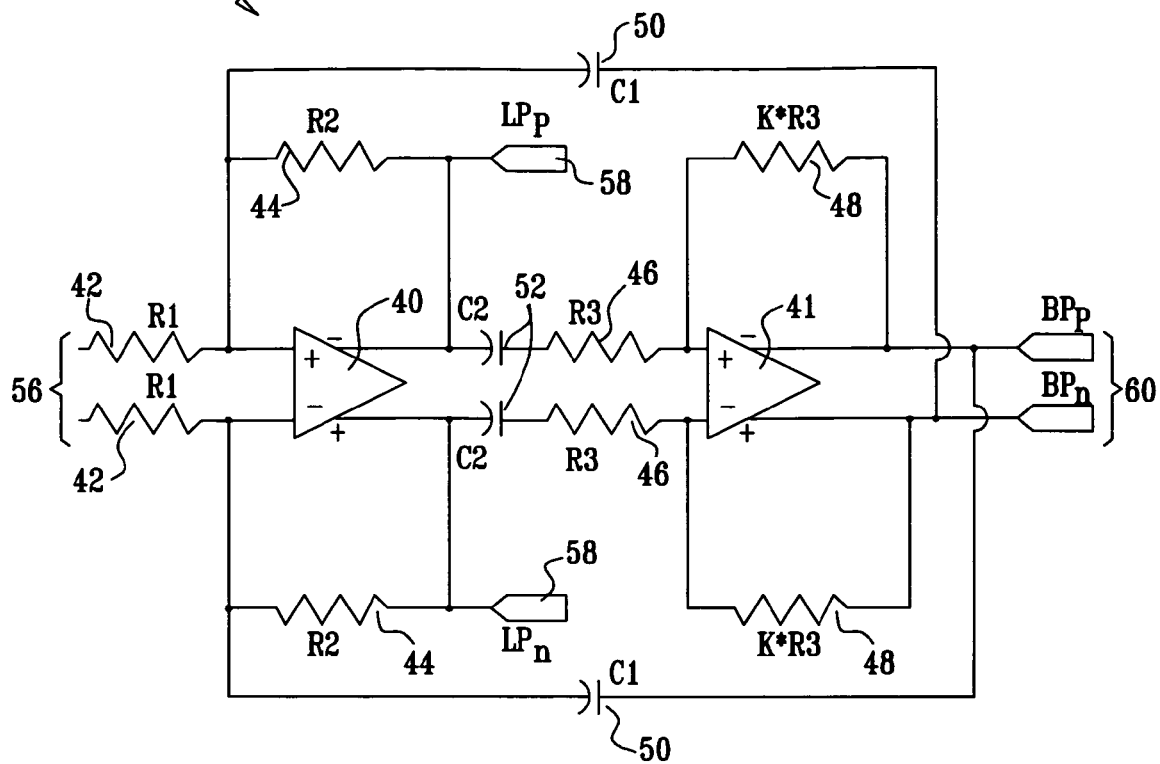
FIG. 3 is a circuit diagram that schematically illustrates a band-pass filter, in accordance with an embodiment of the present invention.

FIG. 3 is a circuit diagram that schematically shows details of band-pass filter 26, in accordance with an embodiment of the present invention. Filter 26 comprises two differential active filter stages connected in cascade. A differential input signal is applied to differential inputs 56 of filter 26. The signal is filtered by a first stage (denoted an "LPF stage") comprising a first operational amplifier 40, input resistors 42 denoted $R_1$ and inner feedback loop resistors 44 denoted $R_2$. The differential outputs of the first filter stage can be sampled using LP outputs 58.

The output of the first filter stage is applied to a second filter stage via coupling capacitors 52 denoted $C_2$ and resistors 46 denoted $R_3$. The second filter stage comprises a second operational amplifier 41 and inner feedback loop resistors 48. (As shown in the figure, resistors 48 are assigned a resistance value equal to $K \cdot R_3$. K is a gain constant, whose use in setting the gain of filter 26 is explained below. $R_3$ is the resistance value of resistors 46.)

An outer feedback loop, comprising capacitors 50 denoted $C_1$, connects the outputs of the second filter stage to the inputs of the first filter stage. The outer feedback loop is phase-inverting, connecting the positive output to the negative input, and vice versa. The differential output of the second filter stage, which comprises the total output of filter 26, is produced at differential outputs 60.

A method for assigning the appropriate component values for the different resistors and capacitors shown in FIG. 3 is described in FIG. 4 below. In some embodiments, the circuitry of FIG. 3 is fabricated and/or mounted on a suitable substrate, as part of an RFIC. In other embodiments, some or all of the circuitry of filter 26 can be produced using discrete components.

As will be shown below, the closed loop transfer function of filter 26 comprises two zeros and one pole. In some embodiments, the two zeros are located at a zero frequency. The frequency of the pole corresponds to the center frequency of the filter's passband. At high frequencies, the phase of the transfer function approaches 90°, which provides improved phase margin in comparison to other active filter configurations. The large phase margin enables the filter to remain stable over a high dynamic range of input signals.

In some embodiments, such as the embodiment shown in FIG. 3, filter 26 is arranged in a balanced configuration (sometimes referred to as a differential configuration). The balanced configuration is particularly suitable for implementing filter 26 in an RFIC, as it is highly immune to common-mode noise, which is typically present in analog integrated circuits such as RFICs.

The s-space transfer function of filter 26 is given by:

$$H_{BPF}(s) = \frac{V_o}{V_i} = -\frac{s \cdot G_{BPF} \cdot \frac{\omega_0}{Q}}{s^2 + s \cdot \frac{\omega_0}{Q} + \omega_0^2}$$

wherein $V_O$ denotes the output voltage at outputs 60, and $V_i$ denotes the input voltage at inputs 56. $\omega_0$ denotes the frequency of the closed loop pole described above. $G_{BPF}$ denotes the gain of filter 26 at $\omega = \omega_0$ between inputs 56 and outputs 60, and is given by $G_{BPF} = K \cdot R_2 / R_1$. Q denotes the quality factor of the filter, and is given by:

$$Q = \frac{\sqrt{K \cdot C_1 \cdot C_2 \cdot R_2 \cdot R_3}}{C_2 \cdot R_3}$$

$\omega_0$ is given by:

$$\omega_0 = \frac{1}{\sqrt{K \cdot C_1 \cdot C_2 \cdot R_2 \cdot R_3}}$$

The s-space transfer function of the first (LPF) filter stage is given by:

$$H_{LPF}(s) = \frac{V_y}{V_i} = -\frac{G_{LPF} \cdot \left(s \cdot \frac{\omega_0}{Q} + \omega_0^2\right)}{s^2 + s \cdot \frac{\omega_0}{Q} + \omega_0^2}$$

wherein $V_y$ denotes the output of the first filter stage at LP outputs 58. $G_{LPF}$ denotes the gain of the first filter stage at $\omega=0$, given by $G_{LPF}=R_2/R_1$.

In some embodiments, two or more band-pass filters, each having the configuration of filter 26, can be connected in series (also referred to as "cascading") to produce a filter chain. Using a filter chain is sometimes desirable in order to improve the performance of the filter. Connecting several filters in series typically enables achieving high filtering performance for the overall chain, while each individual filter can have a relatively low Q factor. The low Q factor improves the filter's stability. Furthermore, the lower Q reduces the sensitivity of the filter to component value tolerances, introduced by the RFIC fabrication process. The different filters in the chain may differ in terms of their component values, and consequently their transfer functions. The spectral zeros of the chain's transfer function can be controlled by adjusting the gains of the individual filters.

Filter Design Method

Figure 4:
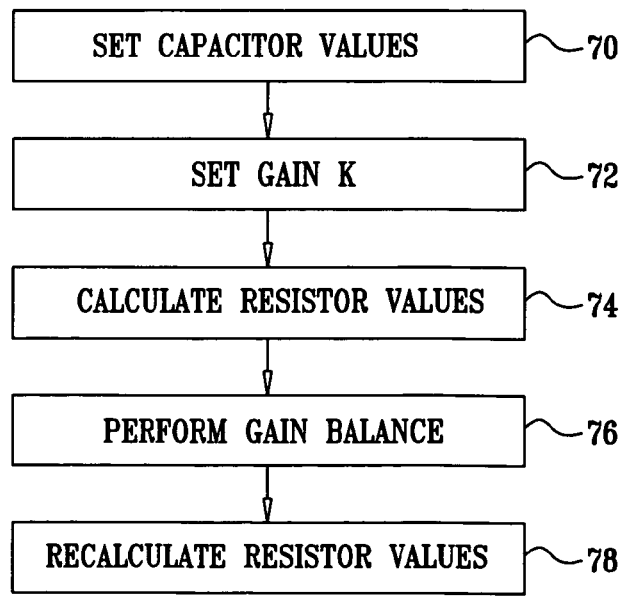
FIG. 4 is a flow chart that schematically illustrates a method for designing a band-pass filter, in accordance with an embodiment of the present invention.

FIG. 4 is a flow chart that schematically illustrates a method for designing band-pass filter 26, in accordance with an embodiment of the present invention. In some embodiments, the a-priori design requirements for the filter comprise the desired center frequency $\omega_0$, the desired quality factor Q and the desired filter gain $G_{BPF}$. In other embodiments it may be desirable to design filter 26 to a bandwidth BW. Since Q and BW are interrelated, the quality factor can be determined using the relation $Q=\omega_0/BW$.

The method begins by assigning capacitors 50 and 52 with capacitance values $C_1$ and $C_2$, respectively, at a capacitance setting step 70. The two capacitance values can be set to any convenient value. Suitable capacitance values are typically in the range of several picofarads (pF).

The gain constant K is set to an initial value at an initial gain setting step 72. In one embodiment, the initial value given to K is the desired filter gain $G_{BPF}$. Since $G_{BPF}=K \cdot R_2/R_1$, this setting implies that $R_2=R_1$ at this stage.

The resistance values of resistors 42, 44, 46 and 48 are determined, at a resistance setting step 74. The values of $R_1$, $R_2$ and $R_3$ are calculated by solving the three equations $$\omega_0 = \frac{1}{\sqrt{K \cdot C_1 \cdot C_2 \cdot R_2 \cdot R_3}}, \quad Q = \frac{\sqrt{K \cdot C_1 \cdot C_2 \cdot R_2 \cdot R_3}}{C_2 \cdot R_3}$$

and $G_{BPF}=K \cdot R_2/R_1$ given above, after introducing the known values of $C_1$ and $C_2$ and the desired values of $\omega_0$, Q and $G_{BPF}$.

Resistors 42 are set to a resistance of $R_1$, resistors 44 are set to a resistance of $R_2$, resistors 46 are set to a resistance of $R_3$ and resistors 48 are set to a resistance of $K \cdot R_3$. At this stage, the total gain of filter 26 is determined by amplifier 41. After assigning the capacitance and resistance value, this gain is set to the desired gain $G_{BPF}$.

In some embodiments, it is desirable to use LP outputs 58 as well. In these embodiments, it is typically desirable to set the gain of the first filter stage (between inputs 56 and LP outputs 58) to be equal to $G_{BPF}$.

The final gain of filter 26 is set at a gain balancing step 76. First, the difference between the gain $G_{BPF}$ of filter 26 and the gain $G_{LPF}$ of the first filter stage is evaluated at one or more frequencies in the passband of filter 26. In one embodiment, the gain difference is evaluated at $\omega=\omega_0$. Alternatively, the gain difference is evaluated by calculating an average gain difference given by $G_{diff}=E\{H_{BPF}(s)/H_{LPF}(s)\}$, at several frequencies inside the passband of filter 26. The function $E\{\ \}$ denotes statistical averaging. Further alternatively, the two transfer functions $H_{BPF}(S)$ and $H_{LPF}(S)$ can be plotted on a common scale, and the average gain difference estimated graphically from the plots. Having estimated the average gain difference $G_{diff}$, the gain constant K is set to $K=G_{BPF}/G_{diff}$. The re-calculated value of K also determined a new value for resistors 48, namely $K \cdot R_3$.

The resistance values are now recalculated at a resistance recalculation step 78. Step 78 repeats the process of resistance setting step 74 above, using the new value of K.

The output of steps 70-78 above is a set of values for capacitors 50 and 52 and for resistors 42, 44, 46 and 48. Assigning these component values produces a band-pass filter having the desired center frequency $\omega_0$, quality factor Q and gain $G_{BPF}$.

In an alternative embodiment, the re-calculation of K and the recalculation of the resistance values can be eliminated. In this embodiment, the value of K is set at step 72 to be $$K = Q \cdot \left[1 + \sqrt{\frac{1}{Q^2}}\right]$$

Step 74 is performed using this value of K, and steps 76 and 78 are omitted.

As noted above, the band-pass filter produced using this method is a balanced filter, which remains stable at strong signal conditions without distorting the filtered signal.

Although the methods and devices described herein mainly address balanced band-pass filters, the principles of the present invention can be used, mutatis mutandis, to produce other types of filters, such as low-pass or band-stop filters, which are stable under strong signal conditions. The filters can be implemented using either differential (balanced) or single-ended configurations.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A filter comprising:
   an input and an output;

first and second filter stages, having respective stage inputs and stage outputs, connected in cascade between the input and the output, each filter stage comprising an amplifier having an amplifier input and an amplifier output and an inner feedback loop connecting the amplifier output to the amplifier input; and an outer feedback loop connecting the stage output of the second filter stage with the stage input of the first filter stage, wherein the first and second filter stages and the outer feedback loop are arranged so that an s-space closed-loop transfer function of the filter comprises two zeros and a single pole.

2. The filter according to claim 1, wherein the stage input of the first filter stage comprises a differential input, wherein the stage output of the second filter stage comprises a differential output, and wherein the first and second filter stages comprise differential stages in which the amplifier comprises a balanced amplifier.

3. The filter according to claim 1, wherein at least one of the two zeros is located at a zero frequency.

4. The filter according to claim 1, wherein the closed-loop transfer function comprises a band-pass transfer function.

5. The filter according to claim 1, wherein the filter is implemented in a radio-frequency integrated circuit (RFIC).

6. The filter according to claim 1, wherein at least part of the filter is implemented using discrete components.

7. A filter chain comprising two or more filters connected in series, each filter comprising:
an input and an output;
first and second filter stages, having respective stage inputs and stage outputs, connected in cascade between the input and the output, each filter stage comprising an amplifier having an amplifier input and an amplifier output and an inner feedback loop connecting the amplifier output to the amplifier input; and
an outer feedback loop connecting the stage output of the second filter stage with the stage input of the first filter stage, wherein the first and second filter stages and the outer feedback loop are arranged so that an s-space closed loop transfer function of the filter comprises two zeros and a single pole.

8. The filter chain according to claim 7, wherein a transfer function of the filter chain comprises spectral zeros controlled by gains of the two or more filters.

9. A radio receiver comprising:
a mixer, which is coupled to down-convert an input radio-frequency (RF) signal using a local oscillator (LO) signal, so as to produce an intermediate-frequency (IF) signal; and
a band-pass filter, which is coupled to filter the IF signal to produce a desired frequency range of received signals, the filter comprising:
a differential input and a differential output;
first and second differential filter stages, having respective stage inputs and stage outputs, connected in cascade between the differential input and the differential output, each filter stage comprising a balanced amplifier having an amplifier input and an amplifier output and an inner feedback loop connecting the amplifier output to the amplifier input; and
an outer feedback loop connecting the stage output of the second filter stage with the stage input of the first filter stage, wherein the first and second filter stages and the outer feedback loop are arranged so that an s-space closed loop transfer function of the band-pass filter comprises two zeros and a single pole.

10. The receiver according to claim 9, wherein at least one of the mixer and the band-pass filter are implemented in a radio-frequency integrated circuit (RFIC).

11. A method for producing a filter, comprising:
forming an input and an output;
connecting first and second filter stages having respective stage inputs and stage outputs in cascade between the input and the output, each filter stage comprising an amplifier having an amplifier input and an amplifier output;
in each filter stage, connecting an inner feedback loop between the amplifier output and the amplifier input; and
connecting an outer feedback loop between the stage output of the second filter stage and the stage input of the first filter stage, wherein the first and second filter stages and the outer feedback loop are arranged so that an s-space closed loop transfer function of the filter comprises two zeros and a single pole.

12. The method according to claim 11, wherein forming the input comprises forming a differential input, wherein forming the output comprises forming a differential output, and wherein connecting the first and second filter stages comprises connecting first and second differential filter stages in which the amplifier comprises a balanced amplifier.

13. The method according to claim 11, wherein at least one of the two zeros is located at a zero frequency.

14. The method according to claim 11, wherein the filter comprises a band-pass filter.

15. The method according to claim 11, wherein the filter is implemented in a radio-frequency integrated circuit (RFIC).

16. The method according to claim 11, wherein at least part of the filter is implemented using discrete components.

17. The method according to claim 11, and comprising:
accepting filter requirements comprising at least one of a center frequency, a gain, a quality factor and a bandwidth;
assigning capacitance values to capacitors of the filter;
assigning a gain value K to the inner feedback loop of the second filter stage; and
computing resistance values of resistors of the filter, responsively to the filter requirements, the capacitance values and the inner feedback loop gain.

18. A method for producing a filter chain, comprising:
producing two or more filters, wherein producing each filter comprises:
forming an input and an output;
connecting first and second filter stages having respective stage inputs and stage outputs in cascade between the input and the output, each filter stage comprising an amplifier having an amplifier input and an amplifier output;
in each filter stage, connecting an inner feedback loop between the amplifier output and the amplifier input; and
connecting an outer feedback loop between the stage output of the second filter stage and the stage input of the first filter stage, wherein the first and second filter stages and the outer feedback loop are arranged so that an s-space closed loop transfer function of the filter comprises two zeros and a single pole; and
connecting the two or more filters in series to produce the filter chain.

19. The method according to claim 18, wherein producing the two or more filters comprises setting gains to the two or more filters in order to control spectral zeros of a transfer function of the filter chain.

20. A method for receiving a radio signal, comprising:
down-converting a an input radio-frequency (RF) signal by a mixer using a local oscillator (LO) signal, so as to produce an intermediate-frequency (IF) signal; and
filtering the IF signal by a band-pass filter, so as to produce a desired frequency range of received signals, wherein the band-pass filter comprises:
a differential input and a differential output;
first and second differential filter stages having respective stage inputs and stage outputs connected in cascade between the differential input and the differential output, each filter stage comprising a balanced amplifier having an amplifier input and an amplifier output and an inner feedback loop connecting the amplifier output to the amplifier input; and
an outer feedback loop connecting the stage output of the second filter stage with the stage input of the first filter stage, wherein the first and second filter stages and the outer feedback loop are arranged so that an s-space closed loop transfer function of the filter comprises two zeros and a single pole.

21. The method according to claim 20, wherein at least one of the mixer and the band-pass filter are implemented in a radio-frequency integrated circuit (RFIC).

* * * * *